United States Patent [19]
Szepesi

[11] Patent Number: 4,929,882
[45] Date of Patent: May 29, 1990

[54] APPARATUS FOR CONVERTING DC TO DC HAVING NON-FEED BACK VARIABLE HYSTERETIC CURRENT-MODE CONTROL FOR MAINTAINING APPROXIMATELY CONSTANT FREQUENCY

[75] Inventor: Tamas S. Szepesi, San Jose, Calif.

[73] Assignee: National Semiconductor Corporation, Santa Clara, Calif.

[21] Appl. No.: 65,584

[22] Filed: Jun. 23, 1987

[51] Int. Cl.$^5$ ............................................. H02M 3/156
[52] U.S. Cl. ..................................... 323/222; 323/285; 323/286
[58] Field of Search ................. 323/272, 282, 284–281, 323/300

[56] References Cited

U.S. PATENT DOCUMENTS

| | | | |
|---|---|---|---|
| 3,294,981 | 12/1966 | Bose | 323/285 |
| 4,311,954 | 1/1982 | Capel | 323/284 |
| 4,392,103 | 7/1983 | O'Sullivan et al. | 323/284 |
| 4,437,146 | 3/1984 | Carpenter | 363/79 |
| 4,529,927 | 7/1985 | O'Sullivan et al. | 323/285 |
| 4,761,725 | 8/1988 | Henze | 323/241 |

FOREIGN PATENT DOCUMENTS 22490 2/1985 Japan ...................................... 363/41

OTHER PUBLICATIONS

Weischedel "An Application of Frequency Entrainment in a DC-to-DC Converter", IEEE Trans. on Ind. Appl., vol. IA-8, No. 4, pp. 437-442, (Jul./Aug. 1972).
T. Szepesi, "Stabilizing the Frequency of Hysteretic Current-Mode DC/DC Converters", IEEE Trans. on Power Electr., vol. PE-2, No. 4, pp. 302-312, Oct. 1987.

Primary Examiner—William H. Beha, Jr.
Attorney, Agent, or Firm—Limbach, Limbach & Sutton

[57] ABSTRACT

An hysteretic current-mode controlled DC to DC converter has an input voltage, an output voltage and a control switch. The switch alternately coupled the input voltage into an energy storage inductor. It is controlled by an hysteretic conparater sensing the current of the inductor and having turn-on and turn-off limits. The limits are symmetrical about an average inductor current. The limits are adjusted by simple non-closed-loop methods to maintain an approximately constant frequency of oscillation. The average inductor current is controlled by an error amplifier to maintain a constant output voltage. The two controls are independent.

4 Claims, 10 Drawing Sheets

HYSTERETIC BUCK CONVERTER

BUCK POWER-STAGE WITH CURRENT COMPARATOR

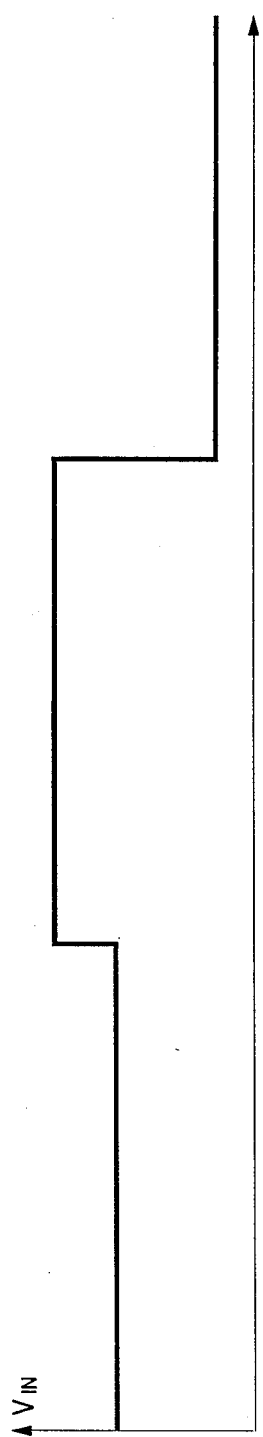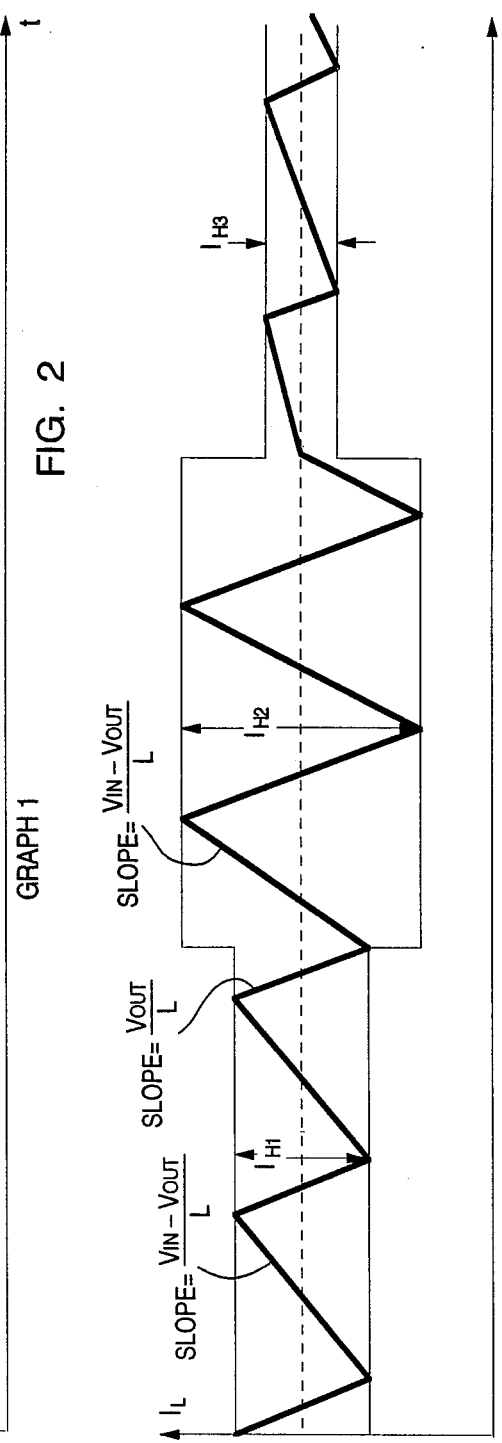

HYSTERETIC BUCK CONVERTER $$I_H = \frac{1}{fL}\left(V_o - \frac{V_o^2}{V_i}\right) = \frac{R_H}{R_S} I_h = \frac{R_H}{R_S}\frac{R_i}{R_o^2}\left(V_o - \frac{V_o^2}{V_i}\right)$$

$$fL = \frac{R_o^2}{R_i}\frac{R_S}{R_H}$$

NONLINEAR CIRCUIT FOR BUCK CONVERTER

CIRCUIT FOR DUTY CYCLE PROPORTIONAL FREQUENCY CONTROL

FEEDBACK CIRCUIT FOR PLL

PLL BLOCK DIAGRAM

LIGHT/HEAVY BOUNDARY DETECTION LOGIC

MODIFIED CURRENT PROGRAMMING CIRCUIT

BLOCK DIAGRAM OF A FIXED FREQUENCY HYSTERETIC CURRENT-MODE CONVERTER

BOOST POWERSTAGE

BUCK-BOOST POWERSTAGE

APPARATUS FOR CONVERTING DC TO DC HAVING NON-FEED BACK VARIABLE HYSTERETIC CURRENT-MODE CONTROL FOR MAINTAINING APPROXIMATELY CONSTANT FREQUENCY

FIELD OF THE INVENTION

This invention relates to the field of DC to DC converters. More particularly, this invention relates to hysteretic current-mode converters for which the operating frequency has been stabilized.

BACKGROUND OF THE INVENTION

Current-mode control of DC to DC converters has many advantages over traditional pulse width modulated control including providing better dynamic performance and offering the ability to operate multiple converters in parallel. The main disadvantage associated with this method is the so called "open loop instability" which appears if the converter is operated at a duty cycle greater than 50%. Hysteretic current-mode control also overcomes open loop instability. However, the frequency changes as the input voltage of the converter changes. The turn on and turn off of the converter power stages creates noise spikes which may cause problems when running two or more converters in parallel.

Hysteretic current-mode control is one of the ways to avoid open loop instability, maintain a stable operating frequency and still retain all the advantages of the current-mode control.

It is an objective of the present invention to provide hysteretic current-mode control DC to DC converters with stable operating frequency.

It is another object of the present invention to provide a nonlinear circuit for hysteretic current-mode control DC to DC converters which establish appropriate hysteretic current limits.

It is still another object of the present invention to provide duty cycle proportional control for hysteretic current-mode control DC to DC converters.

It is yet another object of the present invention to provide a circuit to sense the boundary between heavy and light mode operation in hysteretic current-mode controlled DC to DC converters.

It is a further object of the present invention to provide a circuit which implements hysteretic average current control in heavy mode and constant frequency peak current control in light mode for current-mode DC to DC converters to achieve constant frequency operation in both heavy and light operating modes.

Summary of the Invention

The preferred embodiment of the present invention comprises an hysteretic current-mode controlled stable frequency DC to DC converter having an input voltage and an output voltage comprising:
a. a power stage circuit having:
 (1) an inductor;
 (2) a capacitor;
 (3) a first control switch having an open position and a closed position; and
 (4) a means for oscillating the switch between the open position and the closed position thereby establishing a first duty cycle. The switch in the open position couples the input voltage to the power stage. The switch in the closed position uncouples the input voltage from the power stage.
b. The converter also includes a non-feedback hysteretic means for controlling an electric current through the inductor by the oscillating means, the hysteretic means having a turn-on limit for closing the switch and a turn-off limit for opening the switch, the turn-on and turn-off limits being adjustable to approximately maintain a constant average output voltage and a constant frequency of oscillation.

The average current multiplied by the load impedance is the output voltage. The turn-on and turn-off limits are symmetrical about an average current. The turn-on and turn-off limits are adjustable to maintain a constant output voltage and a constant frequency of oscillation.

BRIEF DESCRIPTION OF THE DRAWINGS

FIG. 2 shows a graph representing changing input voltage to be converted to a constant output voltage.

FIG. 3 shows a graph representing the inductor current for the buck power stage of FIG. 1 responsive to the input voltage of FIG. 2.

Detailed Description of the Preferred Embodiment

Figure 1:
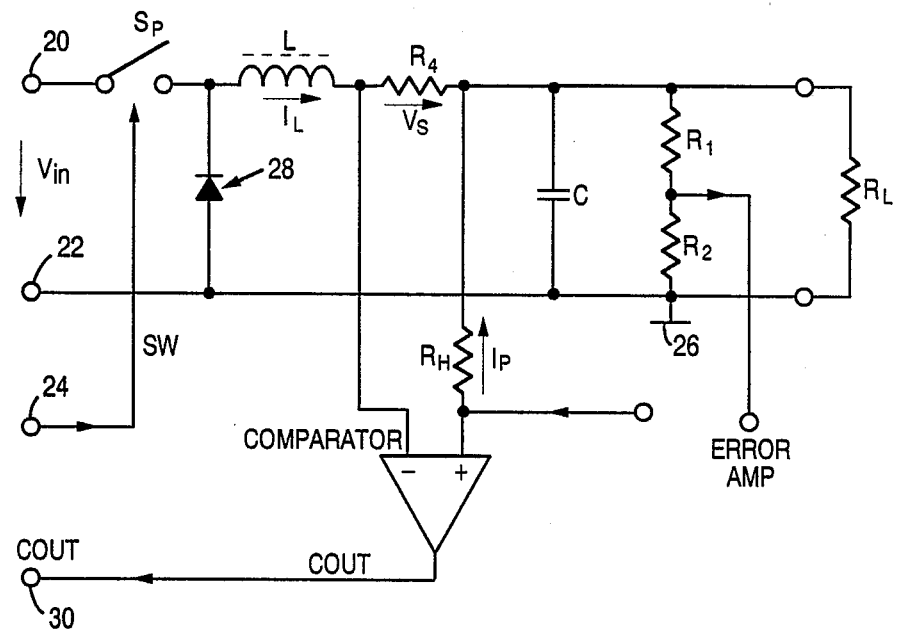
FIG. 1 shows a schematic diagram of a buck power stage with a current comparator.

For current-mode controlled DC to DC converters the output voltage is controlled by an electronic circuit which measures a level of electric current within the circuit, compares that measured level to a predetermined desired level, and develops a response to that measurement elsewhere in the circuit in order to more accurately achieve that desired level. A buck power stage utilized in the preferred embodiment of the present invention is shown in FIG. 1. The inductor current $I_L$ is measured, and if necessary, modified in order to form the desired output voltage $V_{out}$. The inductor current is inferentially measured by determining the voltage across a small sensing resistor $R_S$ in series with the inductor L.

The buck converter of FIG. 1 converts an input voltage $V_{in}$ to a desired output voltage $V_{out}$. The input voltage $V_{in}$ is applied to a pair of terminals 20 and 22 of the buck power stage. The voltage $V_{in}$ is turned on and turned off relative to the buck power stage by alternately closing and opening the switch $S_p$. The switch $S_p$ is controlled by signal SW which is applied to terminal 24. Terminal 22 is at ground potential 26. The anode of diode 28 is coupled to terminal 22 and the cathode is coupled to the switch $S_P$ and to an inductor L. The inductor L is coupled to sensing the resistor $R_S$ and to the negative terminal of the comparator. The other terminal of the sensing resistor $R_S$ is coupled to the resistor $R_H$, the capacitor C, the resistor R1 of the voltage divider network and to the output load resistor $R_L$. The capacitor C and the output load resistor $R_L$ are also coupled to ground 26. The resistor $R_1$ is also coupled to the input of the error amplifier which is not shown and to resistor $R_2$ of the voltage divider. Resistor $R_2$ is also connected to ground 26. The positive terminal of the comparator is connected to resistor $R_H$ and is coupled to receive the result of the error amplifier circuit not shown. The output of the comparator $C_{out}$ is coupled to terminal 30 and drives circuitry not shown here.

The output voltage $V_{out}$ is established by integrating the inductor current in the LC filter network. This integrated current is supplied to the load circuit as the converted output voltage $V_{out}$. In order to establish the proper output voltage from a given input voltage, the input voltage $V_{in}$ is switched in and out of the circuit by switching the switch $S_p$. The resulting oscillating signal is integrated in the LC network to form the desired output voltage $V_{out}$.

Figure 12:
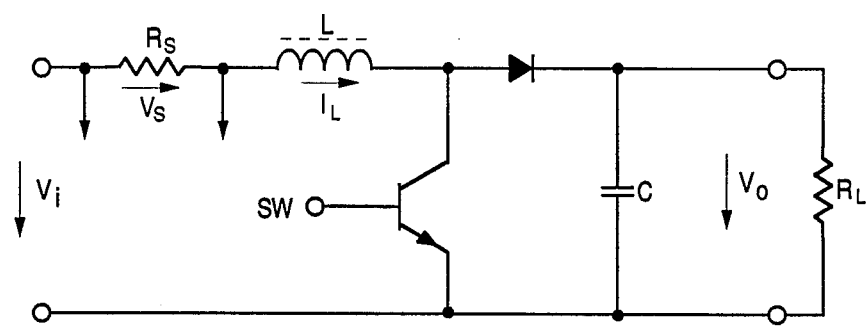
FIG. 12 shows a schematic diagram for a boost power stage.
Figure 13:
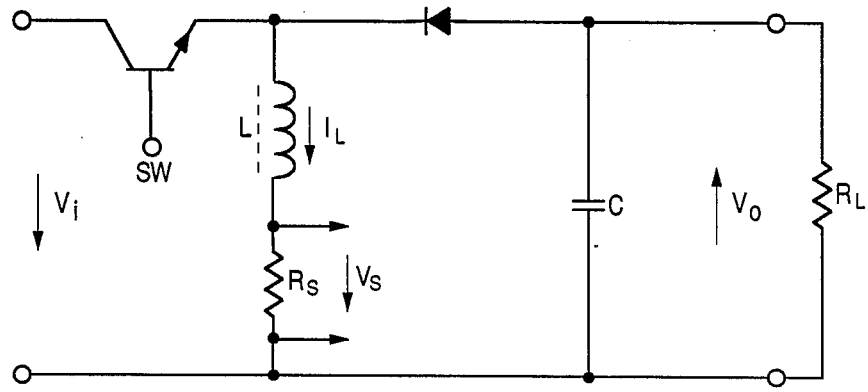
FIG. 13 shows a schematic diagram for a buck-boost power stage.

FIG. 2 graphically shows a sample input voltage $V_{in}$ over an arbitrary period of time. Hysteretic current-mode control results from the control of the turn on and turn off current levels which drive the oscillation. FIG. 3 graphically represents the hysteretic inductor current $I_L$ in response to oscillating the input voltage $V_{in}$ for the buck power stage of FIG. 1 in the hysteretic current-mode controlled DC to DC converter circuit of FIG. 4. It will be clear from the discussion which follows that any power stage may be substituted for the buck power stage. Examples of a typical boost power and buckboost power stages are shown in FIGS. 12 and 13 respectively without discussion.

Upon closing switch $S_p$ the input voltage $V_{in}$ is connected to the remainder of the circuitry and the inductor current $I_L$ rises linearly until it reaches the peak current level. Thereafter, switch $S_p$ opens and the inductor current $I_L$ falls at a linear rate. The linear rise and fall rates need not be, and generally are not, the same. Once the current has fallen to the minimum level, the circuit is "turned on" again and the cycle is repeated. The output voltage $V_{out}$ is the average of the inductor current times the load resistance $R_L$. The inductor current IL is integrated by the LC network forming a smooth relatively ripple free voltage.

If the input voltage $V_{in}$ were to change as shown in FIG. 2 without some other change being made to the circuit, either the average current $A_i$ or the frequency f of oscillation must change. Otherwise the output voltage $V_{out}$ would change which is contrary to the ultimate purpose of a DC to DC converter. One solution to this problem in the past has been to increase the frequency of the turn on and turn off cycle to maintain a constant output voltage $V_{out}$. However, there are certain applications which require a constant frequency DC to DC converter in order to be able to control the effect of noise resulting from the oscillation of the DC to DC converter.

Hysteretic current-mode control has the advantage that it controls the average inductor current and limits the peak current at the same time. The major disadvantage of hysteretic current-mode control is that the operating frequency changes with changing input voltage. This prevents synchronizing multiple converters which is necessary for parallel operation. The ability to use parallel operation, one of the major advantages of using current-mode control, is lost without frequency stabilization.

The period T of the buck power stage oscillation is defined by the equation:

$$T = t_{on} + t_{off} \quad (1)$$

and thus the frequency f is:

$$f = \frac{1}{T} = \frac{1}{t_{on} + t_{off}} \quad (2)$$

The beginning and ending point of the $t_{on}$ and $t_{off}$ cycles are controlled by the switch $S_p$. The hysteresis current $I_H$ is defined to be the total change in inductor current from the lower current limit to the upper current limit shown in FIG. 3 as $I_{H1}$ and $I_{H2}$ and $I_{H3}$ for the three different input voltages, $V_1$, $V_2$ and $V_3$ of FIG. 2. The length of time $t_{on}$ that switch $S_p$ is closed is equal to the value of the inductor L times the excursion of the hysteresis current $I_H$ divided by the difference between the input voltage $V_{in}$ and the output of voltage $V_{out}$. The length of time $T_{off}$ that the switch $S_p$ is open is equal to the value of the inductor L times the excursion of the hysteresis current $I_H$ divided by the output voltage $V_{out}$. These expressions are shown below:

$$t_{on} = \frac{I_H * L}{V_{in} - V_{out}} \quad (3)$$

$$t_{off} = \frac{I_H * L}{V_{out}} \quad (4)$$

The frequency is a function of the hysteresis current $I_H$:

$$f = F(I_H) \quad (5)$$

$$= \frac{1}{I_H L} V_{out} \left(1 - \frac{V_{out}}{V_{in}}\right) \quad (6)$$

thus, $$I_H = \frac{1}{fL} V_{out} \left(1 - \frac{V_{out}}{V_{in}}\right) \quad (7)$$

By controlling the excursion of the hysteresis current $I_H$, which is a function of the input voltage $V_{in}$ assuming that the output voltage $V_{out}$ is a constant, the frequency may be controlled. Where the input voltage $V_{in}$ varies up or down, such as is shown in FIG. 2, the excursion of the hysteresis current $I_H$ also varies in order to maintain a constant frequency DC to DC conversion as shown in FIG. 3.

Different DC to DC converter power stages may be substituted into an hysteretic converter configuration in place of the buck power stage including boost, buck boost and fly back converters. For the boost power stage the hysteretic current equation is:

$$I_H = \frac{1}{fL} V_{in}\left(1 - \frac{V_{in}}{V_{out}}\right) \qquad (8)$$

For the buck-boost power stage and the fly-back power stage the hysteretic current equation is:

$$I_H = \frac{1}{fL}\left(\frac{V_{in} \cdot V_{out}}{V_{in} + V_{out}}\right) \qquad (9)$$

The present invention includes both open loop and closed loop methods of controlling the value of current hysteresis $I_H$. The open loop methods are easier to implement and operate faster than the closed loop methods. However, the open loop methods depend upon the power stage circuit topology and have a small amount of instability in the frequency due to feedback of the ripple in the output voltage.

Figure 4:
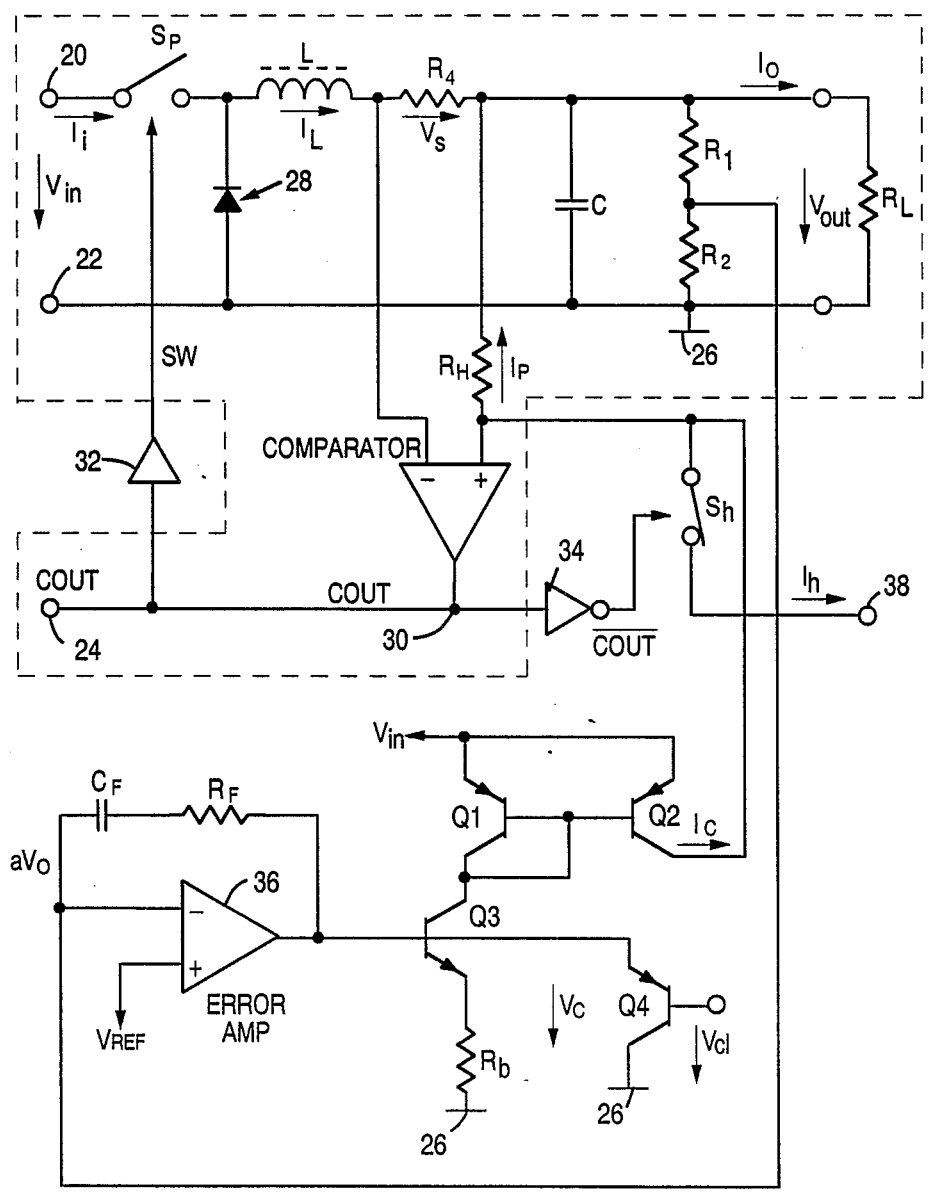
FIG. 4 shows a schematic diagram for an hysteretic buck DC to DC converter.
Figure 5:
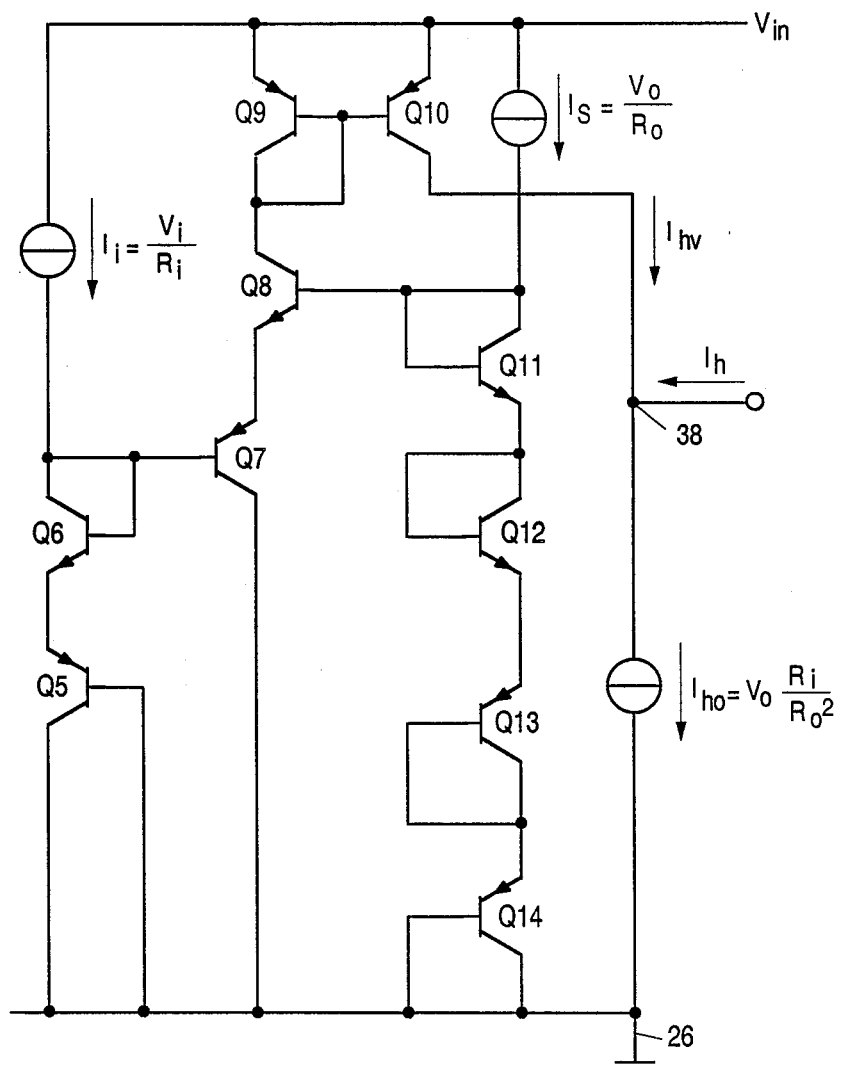
FIG. 5 shows a schematic diagram for a nonlinear circuit for generating the controlling current $I_h$ for an hysteretic buck converter.

FIG. 4 shows the block diagram of a free running open loop hysteretic buck converter with peak programming utilizing the buck converter of FIG. 1. Certain portions of FIG. 4 are identical to FIG. 1. The value of the hysteretic current excursion $I_H$ in FIG. 4 is controlled by the current $I_h$. A nonlinear circuit which generates $I_h$ to control $I_H$ according to equation (7) above is shown in FIG. 5. An alternate circuit which generates a duty cycle proportional $I_h$ is shown is FIG. 6.

In FIG. 4, the comparator output $C_{out}$ 30 is coupled into a non-inverting gate 32 for generating signal SW for controlling switch $S_p$. The comparator node output $C_{out}$ 30 is also coupled to inverting gate 34 for controlling switch $S_h$. Thus, when the switch $S_p$ is closed the switch $S_h$ is open and vice versa. The voltage divider node formed by the resistor network $R_1$ and $R_2$ is coupled to the negative input of the error amp 36. The positive input of the error amp 36 is connected to a reference voltage $V_{ref}$. The output of the error amp 36 is coupled to the negative input of the error amp 36 through the series connection of feedback resistor $R_f$ and feedback capacitor $C_f$. The output of the error amp 36 is also coupled to the base of NPN transistor Q3 and to the emitter of PNP transistor Q4. The emitter of transistor Q3 is coupled to biasing resistor $R_b$. Biasing resistor $R_b$ is also coupled to ground 26. The collector of transistor Q4 is coupled to ground 26. The base of transistor Q4 is coupled to a voltage clamp signal $V_{cl}$.

PNP transistors Q1 and Q2 are configured as a current mirror. The emitters of both transistors Q1 and Q2 are coupled to the input voltage $V_{in}$. The bases of transistors Q1 and Q2 are coupled to eachother, to the collector of transistor Q1 and to the collector of transistor Q3. The collector of transistor Q2 is coupled into the positive input of the comparator and to switch $S_H$. The current $I_c$ passes through the path coupling the collector of Q2 to positive input of the comparator.

When switch $S_P$ is closed, the current $I_L$ through the inductor L increases at a linear rate. The value of that current is sensed in the sensing resistor $R_S$ which is in series with the inductor L. The resistor $R_S$ is coupled in parallel across the inputs to the comparator. Resistor $R_H$ is coupled in series into the path between one terminal of resistor $R_s$ and the positive input to the comparator. The output of the comparator $C_{out}$ controls switches $S_P$ and $S_h$. During a linear rise in the current through the inductor L switch $S_P$ is closed passing more of the power from the input voltage $V_{in}$ into the inductor. This continues to cause the rise in the current $I_L$ through the inductor L. Once the current sensed by the conductor across the sensing resistor $R_S$ reaches a maximum limit the state of the output C out of the comparator changes and the switch $S_P$ opens and the switch $S_h$ closes allowing the current in the inductor L to fall at a linear rate.

The signal received by the comparator from node 38 through the switch $S_h$ will maintain the comparator in this second state until the inductor current falls to its lower limit shown in the graph of FIG. 3. At that point the signal $I_h$ will cause the comparator to again change its state. The input voltage $V_{in}$ is coupled to the circuit. The inductor current $I_L$ increases and the cycle is restarted.

The inductor current $I_L$ is stored as voltage on the plates of the capacitor C. Because of its parallel connection to the output of the circuit the voltage across the capacitor C is equivalent to the output voltage $V_{out}$. A fraction of that voltage $V_{EA}$ is measured from the voltage divider formed by resistors $R_1$ and $R_2$. $V_{EA}$ is coupled to the inverting input of the error amplifier 36 and is compared to the reference voltage $V_{ref}$. This comparison determines how close the actual output voltage $V_{out}$ is to the desired output voltage. The gain of the error amplifier is controlled by the feedback resistor $R_F$ and the feedback capacitor $C_F$ connected in series between the output of the error amplifier and the inverting input of the error amplifier.

The output of the error amplifier is also coupled to the biasing circuit comprised of transistors Q1, Q2, Q3, Q4 and biasing resistor $R_b$. The output of the error amp 36 is coupled to drive the base of Q3. The collector of Q3 is coupled to the collector and base of Q1 which is coupled as a current mirror to the base of Q2. Because of this configuration, whatever current Q3 is forced to draw by the error amplifier necessarily passes through Q1 and is mirrored to pass through Q2. Depending upon the state of switch $S_h$ that current from Q2 either biases the comparator or node 38. Applying an appropriate voltage level $V_{cl}$ clamps the output of the circuit to prevent the circuit from damaging itself in the event that the output load should short circuit and thereby demand more current than the circuit can supply.

When the switch $S_h$ is open the switch Sw is closed. The inductor current is rising. The comparator is using the current $I_c$ as its programming current. The programming current establishes the limit for the comparison presently taking place. $I_c$ is the output from the error amp circuit and its current programming circuit formed by the transistors Q1, Q2, Q3 and Q4 and the resistor $R_b$. Thus, the turn-off limit is the maximum allowable limit. When the switch $S_h$ is closed the switch SW is open. The current in the inductor L is falling. The comparator is using the sum of the currents $I_h$ and $I_c$ for its programming current $I_p$. Thus, the turn-on limit is the maximum limit minus the amount of hysteresis $I_H$ established by the control current $I_h$.

The circuit of FIG. 5 is a nonlinear circuit which forms the open loop controlling current $I_h$. In the nonlinear circuit of FIG. 5 the collector and base of PNP transistor Q5 are coupled to ground 26. The emitter of Q5 is coupled to the emitter of NPN transistor Q6. The base and collector of Q6 are coupled to the base of PNP transistor Q7. The collector of Q7 is connected to ground 26. The emitter of Q7 is coupled to the emitter of NPN transistor Q8. The collector of Q8 is coupled to the collector of PNP transistor Q9. The collector of Q9 is also coupled to the base of Q9 and PNP transistor Q10. Q9 and Q10 are coupled in a current mirror configuration. The emitters of Q9 and Q10 are each coupled to the input voltage $V_{in}$. (This is the same $V_{in}$ previously described in reference to the circuits of FIG. 1 and FIG. 4.) A voltage controlled current source $I_{in}$ is coupled between $V_{in}$ and the collector of Q6. The base and collector of NPN transistor Q11 are coupled to the base of Q8. A current source $I_S$ is coupled between $V_{in}$ and the base and collector of Q11. The emitter of Q11 is coupled to the base and collector of NPN transistor Q12. The emitter of Q12 is coupled to the emitter of PNP transistor Q13. The base and collector of Q13 are coupled to the emitter of PNP transistor Q14. The base and collector of Q14 are coupled to ground 26. The current $I_h$ is coupled to run from switch $S_h$ of FIG. 4 into the node 38. Node 28 is coupled to the collector of Q10 and to the current source $I_{ho}$. The other terminal of $I_{ho}$ is coupled to ground 26.

The value of the current generated by the current source $I_{in}$ is a function of the input voltage $V_{in}$ and the input impedance $R_{in}$ of the circuit measured (or calculated) when switch $S_p$ is closed. That function is shown by the equation:

$$I_{in} = \frac{V_{in}}{R_{in}} \qquad (10)$$

The value of the current generated by the current source $I_S$ is a function of the output voltage $V_{out}$ and the output impedance $R_{out}$ of the circuit measured (or calculated). That function is shown by the equation:

$$I_S = \frac{V_{out}}{R_{out}} \qquad (11)$$

The value of the current generated by the current source $I_{ho}$ is a function of the output voltage $V_{out}$, the input impedance $R_{in}$ of the circuit measured (or calculated) when switch $S_p$ is closed and the output impedance $R_{out}$. That function is shown by the equation:

$$I_{ho} = \frac{R_{in}}{R_{out}^2} V_{out} \qquad (12)$$

Each of these three voltage controlled current source circuits may be built using any standard circuit design techniques commonly in use. These three voltage controlled current sources may be built with op amps for precision applications or in noncritical applications may be built with resistor controlled current mirrors.

This nonlinear forms the hysteretic current equation (7) for the buck converter $$I_H = \frac{1}{fL} V_{out} \left(1 - \frac{V_{out}}{V_{in}}\right) \qquad (7)$$

$$= \frac{R_H}{R_S} I_h \qquad (13)$$

$$= \frac{R_H}{R_S} \frac{R_{in}}{R_{out}^2} \left(V_{out} - \frac{V_{out}^2}{V_{in}}\right) \qquad (14)$$

This nonlinear circuit takes advantage of the current equation for bipolar circuits which requires that $$I_C = I_{co} * e^{(V_{be}/2V_T)} \qquad (15)$$

Thus, the voltage on the collector of transistor Q11 can be represented by:

$$V_{QC11} = 4V_T \ln \frac{I_S}{I_{co}} \qquad (16)$$

The voltage on the collector of transistor Q6 can be represented by:

$$V_{QC6} = 2V_T \ln \frac{I_{in}}{I_{co}} \qquad (17)$$

The voltage across the both of the emitters of Q7 and Q8 is the difference between these two voltages:

$$V_{Q8/Q7} = V_{CQ11} - V_{CQ6} \qquad (18)$$

$$= 4V_T \ln \frac{I_S}{I_{co}} - 2V_T \ln \frac{I_{in}}{I_{co}} \qquad (19)$$

$$= 2V_T \left(\ln \frac{I_S^2}{I_{co}} - \ln \frac{I_{in}}{I_{co}}\right) \qquad (20)$$

Therefore, the collector current for Q7 and Q8 is expressed by the equation:

$$I_{CQ7/Q8} = I_{co} * e^{\left(\frac{2V_T\left(\ln \frac{I_S^2}{I_{co}} - \ln \frac{I_{in}}{I_{co}}\right)}{2V_T}\right)} \qquad (21)$$

$$= \frac{I_S^2}{I_{in}} \qquad (22)$$

$I_h$, the controlled parameter, is coupled to node 38 which is also coupled to a constant current source $I_{ho}$ and to the collector of Q10 which is configured to be a current mirror with Q9. The current in Q9 is driven by the current in Q8. Because of the current mirror configuration of Q9 and Q10 the current in the collector of Q10 is approximately equal to the current in Q8. The current $I_{hv}$ enters node 38 from the collector of Q10. Considering the directions of the current arrows standard convention and Kirchoff's current law requires:

$$I_{hv} + I_h - I_{ho} = 0 \qquad (23)$$

or $$I_h = I_{ho} - I_{hv} \qquad (24)$$

Since $I_{ho}$ is a constant as $I_{hv}$ decreases $I_h$ must increase and vice versa. As $I_{in}$ increases due to an increase in $V_{in}$ the current through Q7 decreases. This causes $I_{hv}$ to decrease thereby increasing the controlled current $I_h$. As $I_h$ increases the excursion of $I_H$ increases as shown in FIG. 2 and FIG. 3. of $I_H$ increases as shown in FIG. 2 and FIG. 3. Conversely, as $V_{in}$ decreases $I_h$ also decreases.

As an alternate open loop approach to that described above $I_h$ may be controlled by building a duty-cycle proportional circuit. For the buck power stage of FIG. 1 the hysteretic control equation (7) has a duty cycle equation:

$$I_H = \frac{1}{fL} V_{out} * d \quad (25)$$

where:

$$d = 1 - \frac{V_{out}}{V_{in}} \quad (26)$$

For the boost power stage the hysteretic current equation is:

$$I_H = \frac{1}{fL} V_{in} * d \quad (27)$$

where:

$$d = 1 - \frac{V_{in}}{V_{out}} \quad (28)$$

For the buck-boost power stage and the fly-back power stage the hysteretic current equation is:

$$I_H = \frac{1}{fL} V_{in} * d \quad (29)$$

where:

$$d = \frac{V_{out}}{V_{in} * V_{out}} \quad (30)$$

Figure 6:
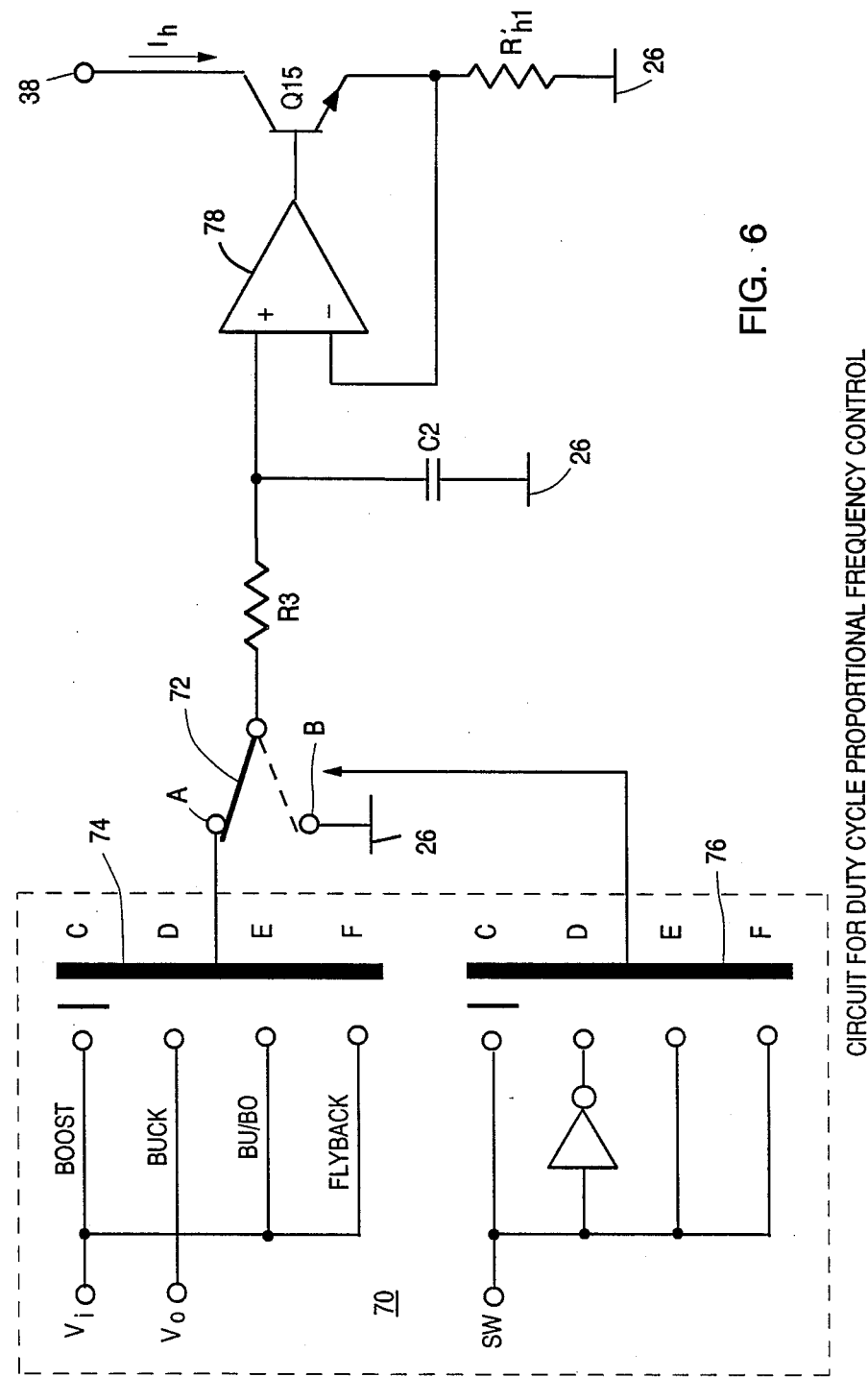
FIG. 6 shows a simplified schematic for a duty cycle proportional frequency control hysteretic DC to DC converter.

A circuit which will implement each of the equations (28), (29) and (30) is shown in FIG. 6.

The switch 70 is a double pole four position switch. The switch 72 is a single pole double position switch. The first pole 74 of the switch 70 is coupled to the position A of switch 72. The second pole 76 of the switch 70 is coupled to control the switch 72. Pole B of the switch 72 is coupled to ground 26.

Position C of switch 70 is for a boost power stage, position D for a buck power stage, position E for a buck-boost power stage and position F for a flyback power stage. Position C, position E and position F of the first pole 74 of the switch 70 are coupled to the input voltage $V_{in}$. Position D of the first pole 74 of the switch 70 is coupled to the output voltage $V_{out}$. Position C, position E and position F of the second pole 76 of the switch 70 are coupled to the signal SW. Position D of the second pole 76 of the switch 70 is coupled to the inverse of signal SW. SW is preferably the same SW identified in FIG. 4 and so is also equal to the output of the comparator $C_{out}$.

The wiper of the switch 72 is coupled to one terminal the resistor R3. The other terminal of the resistor R3 is coupled to the positive input of the amplifier 78 and to one terminal of capacitor C2. The other terminal of the capacitor C2 is coupled to ground 26.

The output of the amplifier 78 is coupled to the base of the NPN transistor Q15. The emitter of the transistor Q15 is coupled to the negative input of the amplifier 78 and the one terminal of the resistor $R_{h1}$. The other terminal of the resistor $R_{h1}$ is coupled to ground 26. The collector of the transistor Q15 is coupled to node 38 of the circuit of FIG. 4. The current $I_h$ which controls the hysteretic current excursion $I_H$ flows into the collector of the transistor Q15.

The input voltage $V_{in}$, or a reference voltage for a buck converter, is applied to the pole A of the switch 72. That voltage is alternately coupled to and uncoupled from the remainder of the circuit by the switch 72. The switch 72 is controlled by the signal SW, or for a buck converter the inverse of SW. The voltage is filtered on the RC network of the resistor R3 and the capacitor C2. The filtered signal in then passed through the driver which includes the amplifier 78, the transistor Q15 and the resistor $R_{1h}$ to form the control current $I_h$. The control signal SW is used in the preferred embodiment to ensure that the frequency and the duty cycle of the control current are the same as for the converter. Some applications may exist where a different frequency signal may be desired. In such applications it will be preferred to use the same duty cycle to simplify the circuit design and to maintain an accurate control of the hysteresis limits.

The circuit of FIG. 6 is representative only. In practice, only one of the four possible configurations of FIG. 6 would be implemented in any given circuit design. The two pole four position switch 70 would be appropriately hard wired in place for the particular power stage being utilized.

The most sophisticated and precise frequency control method is to phase lock the converter to an external fixed frequency clock or in parallel operation to another converter. This is a closed loop method of hysteretic current-mode control. The phase-synchronized operation provided by a Type II loop allows for synchronous turn-on of each converter in the circuit. The turn off instant will often be slightly different in each unit due to tolerances in circuit element values.

Figures 7, 8:
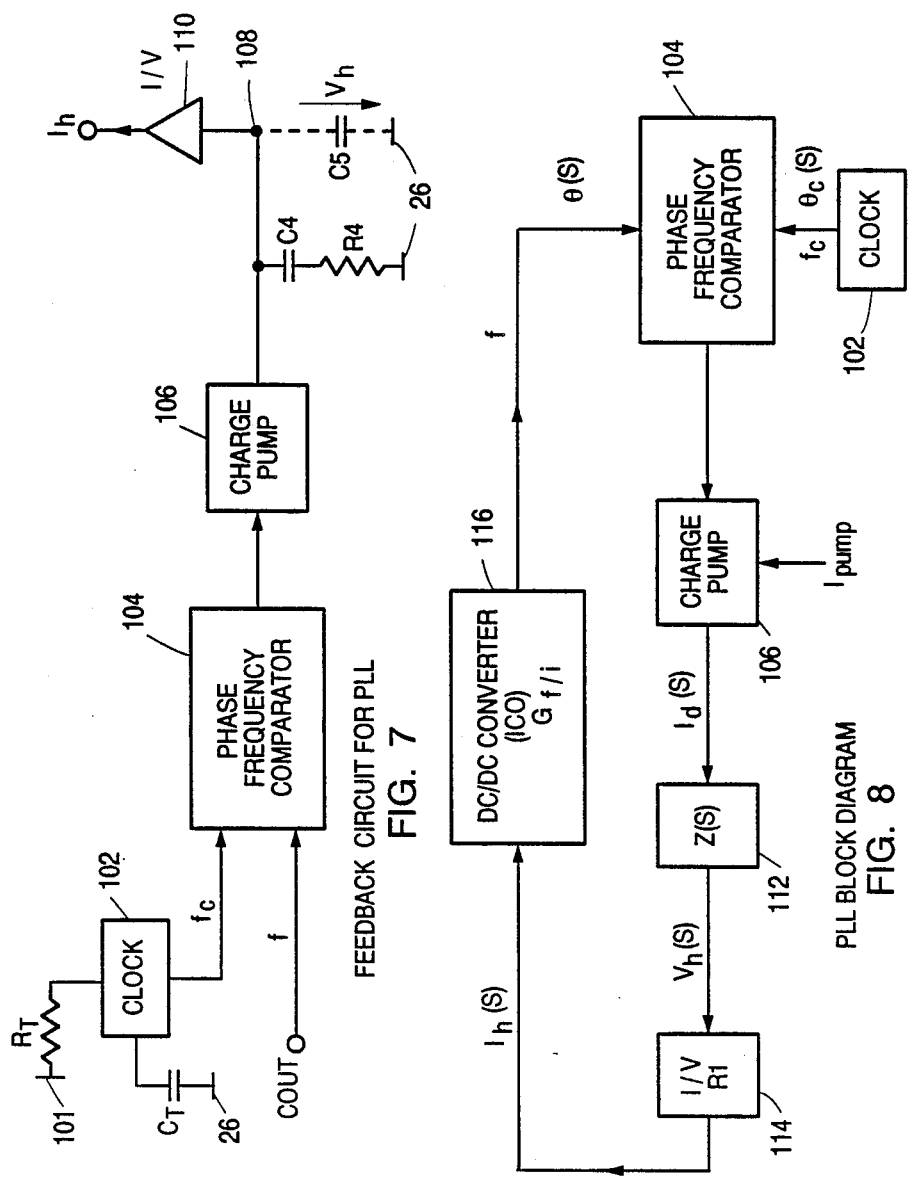
FIG. 7 shows a block diagram for a feedback circuit for a phase-locked-loop hysteretic DC to DC converter.
FIG. 8 shows a block diagram for a phase-locked-loop hysteretic DC to DC converter.

The circuit of FIG. 7 shows a schematic diagram of a feedback circuit for a phase locked loop hysteretic current-mode converter. A voltage level 101 is coupled to a first terminal of the resistor $R_t$. The capacitor $C_t$ is coupled to ground. Both the resistor $R_t$ and the capacitor $C_t$ are coupled to control the clock 102. The output signal of the clock $F_C$ is used to control the phase frequency comparator 104. The phase frequency comparator 104 is also coupled to receive $C_{out}$. The phase frequency comparator 104 compares the clock frequency $F_C$ and the frequency of the current-mode controller F or $C_{out}$ to drive the charge pump 106. The output of the charge pump is coupled to node 108. Node 108 is coupled to the capacitor C4, the capacitor C5 and the voltage to current converter 110. The capacitor C4 is coupled to the resistor R4 which is coupled to ground 26. The capacitor C5 is also coupled to ground. The output of the I-V converter is the hysteresis controlling current $I_h$.

Another view of the same circuit shown in block diagram form in FIG. 8. The clock 102 produces the clock frequency $F_C$. The clock frequency has a phase to it and also may be represented as the clock phase $\Theta_C(s)$. The frequency and phase output of clock 102 is delivered to the phase frequency comparator 104. The phase frequency comparator 104 drives the charge pump 106 which is driven by the pump current $I_{pump}$. The charge pump 106 generates the signal $I_{d(s)}$ which drives the impedance C(s) 112. The impedance generates the hysteretic voltage $V_{h(s)}$ the voltage is introduced to the IV converter 114 which is also resistor $R_1$. The current $I_{h(s)}$ is developed by applying the voltage $V_{h(s)}$ across the IV converter $R_1$ 114. This hysteretic current $I_{h(s)}$ is applied to the DC to DC converter 116 to control the excursion of the inductor current $I_L$. The DC to DC converter is a current controlled oscillator ICO and the output signal having a frequency f and a phase $\Theta(s)$ is applied to the phase frequency comparator 104.

The linearized hysteresis-current to frequency gain of the buck power stage is:

$$G_{f/I} = \frac{\delta f}{\delta I_H} = -\frac{f}{I_H} \quad (31)$$

$$G_{f/i} = G_{f/I} * \frac{R_H}{R_S} = G_{f/I} * A_i \quad (32)$$

$$G_{f/i} = -\frac{f}{I_H} \quad (33)$$

The output phase-input current transfer function which results from the gain of the power stage is:

$$\frac{\Theta(s)}{i_{h(s)}} = \frac{G_{f/I}}{s} = -\frac{f}{s * I_h} \quad (34)$$

The transfer impedance of the loop filter is:

$$Z(s) = R_4 + \frac{1}{s * C_4} = \frac{1 + s/w_z}{s * C_4} \quad (35)$$

The output current of the charge pump is:

$$i_d(s) = I_{pump} \frac{\Theta(s) - \Theta_c(s)}{2\pi} \quad (36)$$

$$= I_{pump} \frac{\Theta_d(s)}{2\pi} \quad (37)$$

where $I_{pump}$ is the peak current of the charge pump. Therefore, the loop gain can be expressed:

$$* \frac{H(s)}{} = -\frac{f}{sI_h} * \frac{1 + s\tau_Z}{sC_4} * \frac{I_{pump}}{2\pi} \frac{1}{R_i} \quad (38)$$

$$= \frac{1 + s\tau_Z}{s^2 \tau^{2i}} \quad (39)$$

where:

$$\tau = \frac{1}{\omega_i} = \frac{2\pi R_i C_4 I_h}{I_{pump} f} \quad (40)$$

Hysteretic mode control with a stable operating frequency as described above only operates in the so called heavy mode. For the purposes of this application "light mode" is defined to be a situation where the load current of the converter drops below $I_H/2$. Once the converter of the present invention changes to light mode operation the convertor will operate in what is known as burst mode. Burst mode operation causes undue noise and ripple on the output of the converter.

For some applications it is possible or likely that the operation will alternate between heavy and light mode. In such applications it will be necessary that the hysteretic current-mode controlled DC to DC conversion revert to prior art techniques when operating in the light mode. This is necessary because even though the present invention is a stable frequency current-mode controlled conversion it does not operate in light mode.

Figure 9:
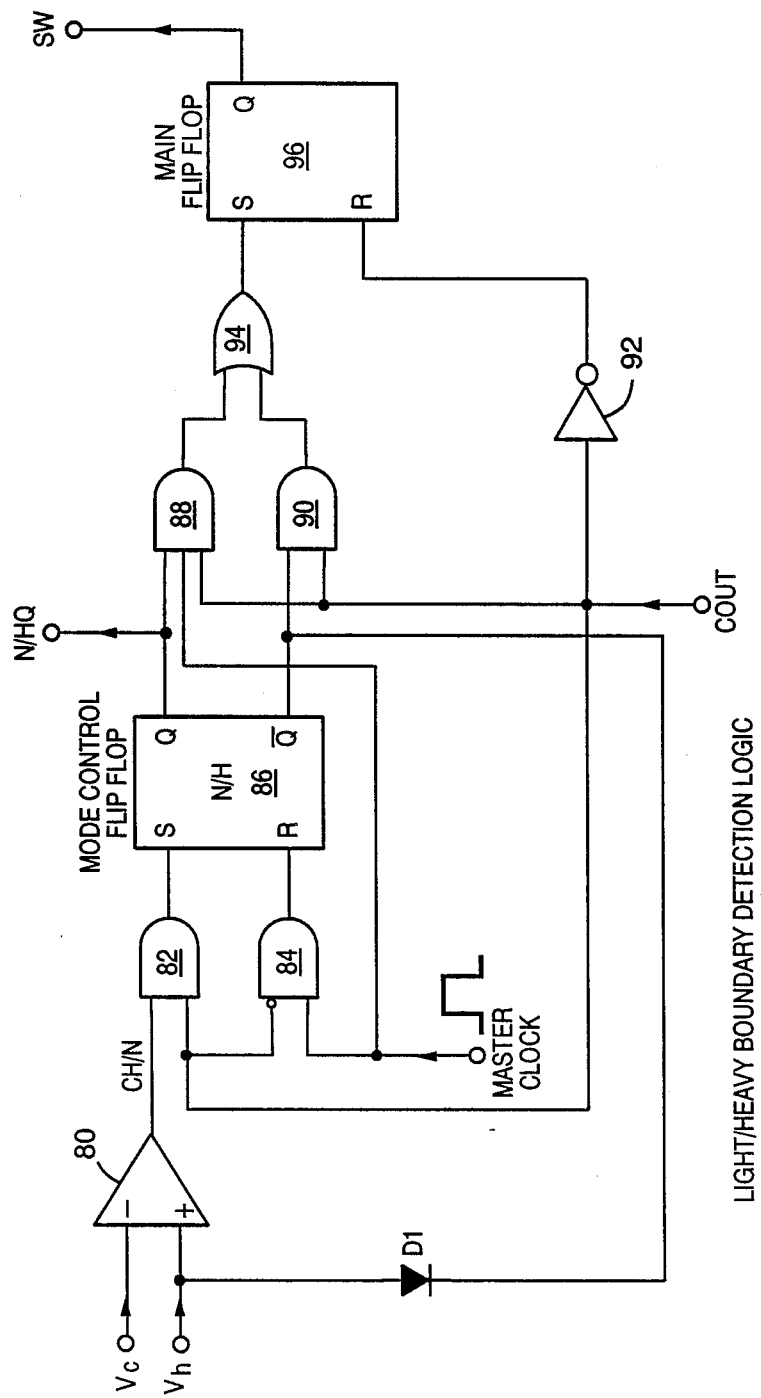
FIG. 9 shows a logic diagram for a light/heavy boundary detection circuit.

The circuit of FIG. 9 senses the light/heavy boundary. In the circuit of FIG. 9 the voltage $V_c$ is coupled to the negative input of the comparator 80. The voltage $V_h$ is coupled to the positive input of the comparator 80 and to the anode of the diode D1. The output of the comparator 80 is coupled to one input of the two input AND gate 82. The other input to the AND gate 82 is coupled to the output of the comparator $C_{out}$ of FIG. 4 and to the inverting input of the two input AND gate 84. The other input to the AND gate 84 is coupled to a master clock signal.

The output of the AND gate 82 is coupled to the SET input of the S/R flip-flop 86. The output of the AND gate 84 is coupled to the RESET input of the S/R flip-flop 86. The non-inverting output of the S/R flip-flop 86 generates the signal N/HQ and is coupled to one input of the three input AND gate 88. The inverting output of the S/R flip-flop 86 is coupled to one input of the two input AND gate 90 and to the cathode of diode D1.

The master clock is coupled to the second input of the AND gate 88. $C_{out}$ is coupled to the third input to the AND gate 88, to the other input of the AND gate 90 and to the input of the invertor 92. The output of the AND gate 88 and the output of the AND gate 90 are each coupled to and input of the two input OR gate 94. The output of the OR gate 94 is coupled to the SET input of the S/R flip-flop 96. The output of the invertor 92 is coupled to the RESET input of the S/R flip-flop 96. The non-inverting output of the S/R flip-flop 96 transmits the signal SW.

The comparator 80 has two analog input signals, $V_c$ and $V_h$. $V_c$ is the output of the error amp shown in FIG. 4 which controls the average current. $V_h$ is the output voltage of the charge pump which controls the hysteresis. When $V_c$, the negative amplifier input, has a smaller magnitude than $V_h$, the positive amplifier input, the comparator 80 will have a binary output of "zero". When $V_c$ has a larger magnitude than $V_h$ the comparator 80 will have a binary output of "one". At the boundary, as the operation of the circuit changes from heavy mode to light mode $V_c$ and $V_h$ will be equal. Once $V_c$ equals $V_h$, the comparator 80 trips and thereby sets the S/R N/H flip-flop 86. By setting the N/H flip-flop the signal N/HQ instructs the circuitry to switch into the so called "normal" mode of operation. The normal mode is the clocked mode of the prior art. In this mode the inductor current oscillates between the peak value, which is set by $(2V_c/R_{in}) * A_{in}$, and zero amps. $A_{in}$ is the average input current.

The S/R flip-flop 96 sets at a master clock edge. The flip-flop 96 resets if the inductor current $I_L$ is greater than the peak inductor current of the normal mode operation $I_{LP}$, $I_L > I_{LP}$. The current comparator enables turn-on if the inductor $I_L$ is less than the offset current $I_{OFFS}$ times the average input current $A_{in}$. The diode D1 pulls down the output of the charge pump $V_h$. If the load becomes heavier, the output of the error amp $V_c$ increases causing an early clock pulse thereby resetting the flip-flop 86 forcing the converter back into hysteretic mode. The hysteresis is determined by $I_h$ and the switch SW is closed again. After a transient period of higher frequency the PLL adjusts $I_h$ to synchronize the converter to the clock which concludes the load cycle.

Figure 10:
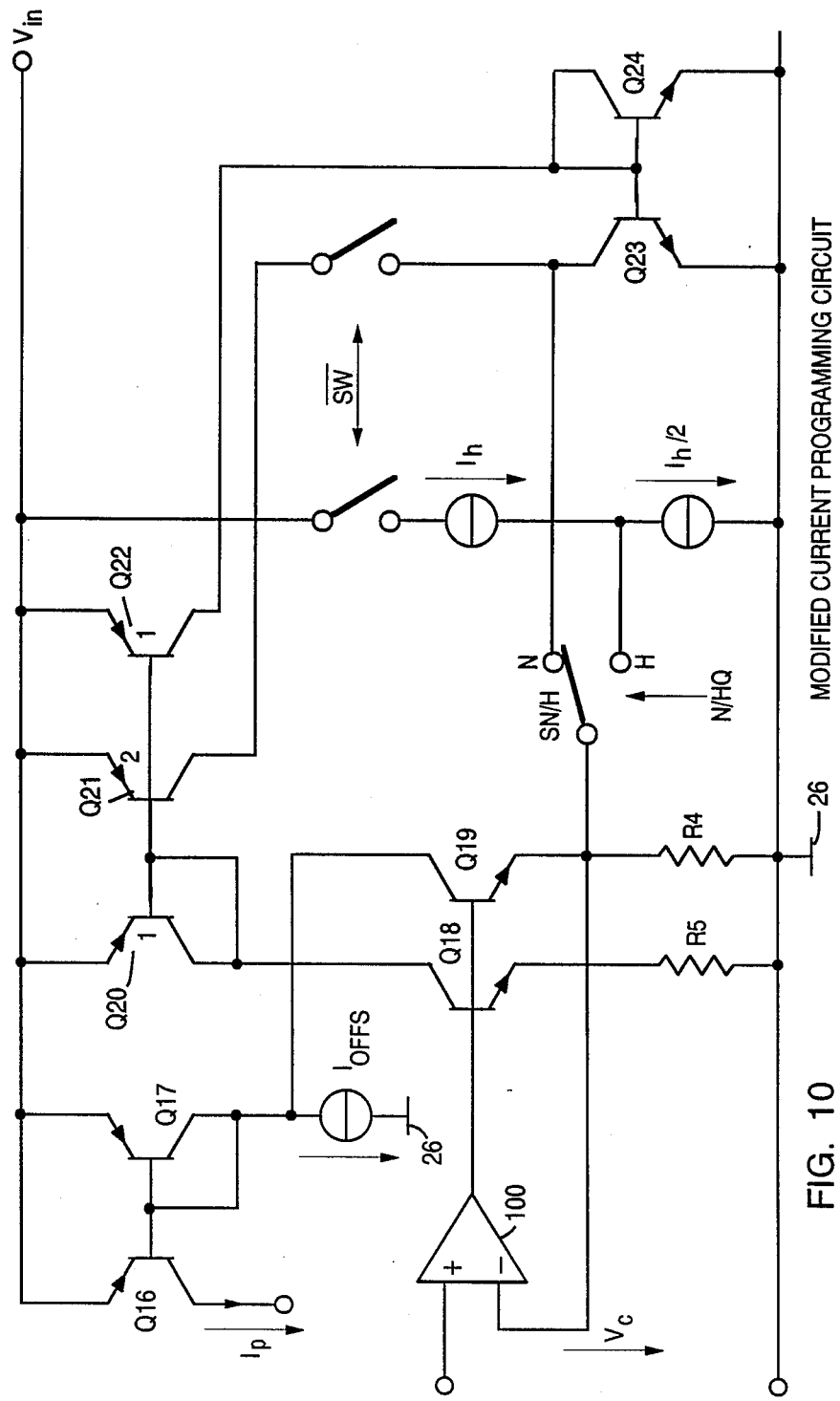
FIG. 10 shows a schematic for a modified current programming circuit.

The circuit of FIG. 10 is a modified current programming circuit which switches between normal operation, i.e. prior art peak current control, and the hysteretic current-mode control of the present invention. It is a modified current programming circuit because it programs the average inductor current rather that the peak inductor current. The programming circuit of FIG. 4 programs the peak current as the turn-off limit and the peak current minus the hysteresis value $I_H$ for the turn-on limit. This modified current programming circuit programs the average current plus one-half the hysteresis value as the turn-off limit and the average current minus one-half the hysteresis value $I_H$ as the turn-on limit.

The circuit of FIG. 10 may be used to replace the transistors Q1, Q2, Q3 and Q4 and the resistor $R_b$ of the circuit of FIG. 4. The positive input of the amplifier 100 is coupled to the output of the error amp 36. The collector of the transistor Q16 is coupled to the positive input of the comparator and the resistor $R_H$.

PNP transistors Q16 and Q17 are connected in a current mirror configuration. The emitters of Q16 and Q17 are coupled to the input voltage $V_{in}$. The bases of Q16 and Q17 are coupled to the collector of Q17. The peak current $I_p$ flows through the collector of Q16 and is coupled into the circuit of FIG. 4 node 38. The collector of Q17 is coupled to the current source $I_{OFFS}$ and to the collector of NPN transistor Q19. The current source $I_{OFFS}$ is also coupled to ground 26. The base of transistor Q19 is coupled to the base of NPN transistor Q18 and to the output of the op amp 100. The voltage $V_c$ is coupled to the non-inverting input of op amp 100. The inverting input of op amp 100 is coupled to the emitter of transistor Q19, to switch N/H and to the resistor R4. The emitter transistor Q18 is coupled to resistor R5. The resistor R4 and the resistor R5 are each also coupled to ground 26. The collector of transistor Q18 is coupled to the current mirror formed by PNP transistors Q20, Q21 and Q22. The collector of Q18 is coupled to the collector of Q20 and to the bases of Q20, Q21 and Q22. The emitter of Q20, Q21 and Q22 are each coupled to the input voltage $V_{in}$. The collector of transistor Q21 is coupled to one pole of the double pole single throw switch S5. The collector of transistor Q22 is coupled to the current mirror formed by NPN transistors Q23 and Q24. The collector of transistor Q22 is coupled to the collector of Q24 and the bases of Q23 and Q24. The emitters of transistors Q23 and Q24 are coupled to ground 26. The collector of transistor Q23 is coupled to the other terminal of the same pole of switch S5 as the collector of transistor Q21 and to the pole N of switch N/H. The first terminal of the other pole of switch S5 is coupled to the input voltage $V_n$. The other terminal of the other pole of switch S5 is coupled to the current source $I_h$. The current source $I_h$ is also coupled to the current source $I_h/2$ and to pole H of the switch N/H. The current source $I_h/2$ is also coupled to ground.

This circuit produces the programmed current $I_p$ which programs the power stage during the peak current or light mode operation of the circuit. The peak current is determined by the current mirror formed by the transistor pair of Q16 and Q17. Because of the offset current source $I_{OFFS}$ in series with the collector of the transistor Q17 the programmed peak current will never be lower than the value established by the offset current, which is usually quite small. The offset current $I_{OFFS}$ is used to avoid the necessity of sensing a negative or zero current. The positive input of the amplifier 100 is driven by the output of the error amplifier $V_c$. The negative input of the amplifier 100 is coupled to the wiper of switch N/HQ, to the emitter of Q19 and to the resistor R4. The output of the amplifier is coupled to the base of the transistor Q19.

The current through Q19 and through the offset current source are operating in parallel to the control side of the current mirror and thereby directly control the value of the peak current $I_p$. If the switch N/HQ is in the H position and the switch SW is closed so that the inductor current $I_L$ is rising, the value of the peak current, i.e. the turn-off limit, will be controlled by the sum of an average inductor current programmed into the reference voltage $V_{ref}$ of the error amp 36 and the current source $I_h/2$. If the switch N/HQ is in the H position and the switch SW is open so that the inductor current is falling, the value of the turn-on limit will be controlled by the subtracting the current source $I_h$ from the peak current above.

If the switch N/HQ is in the N position and the switch SW is closed so that the inductor current $I_L$ is rising, the value of the peak current will be controlled by the current flowing through the current mirror formed by the transistors Q23 and Q24. The current available to this current mirror is controlled by the multiple source current mirror of the transistors Q20, Q21 and Q22. The multiple source current mirror is in turn controlled by the transistor Q18 which is driven by the output of the amplifier 100. This peak current is doubled to avoid transients at the light/heavy boundary. There is no turn-off limit per se. Rather the circuit operation becomes discontinuous at the low level established by $I_{OFFS}$.

Figure 11:
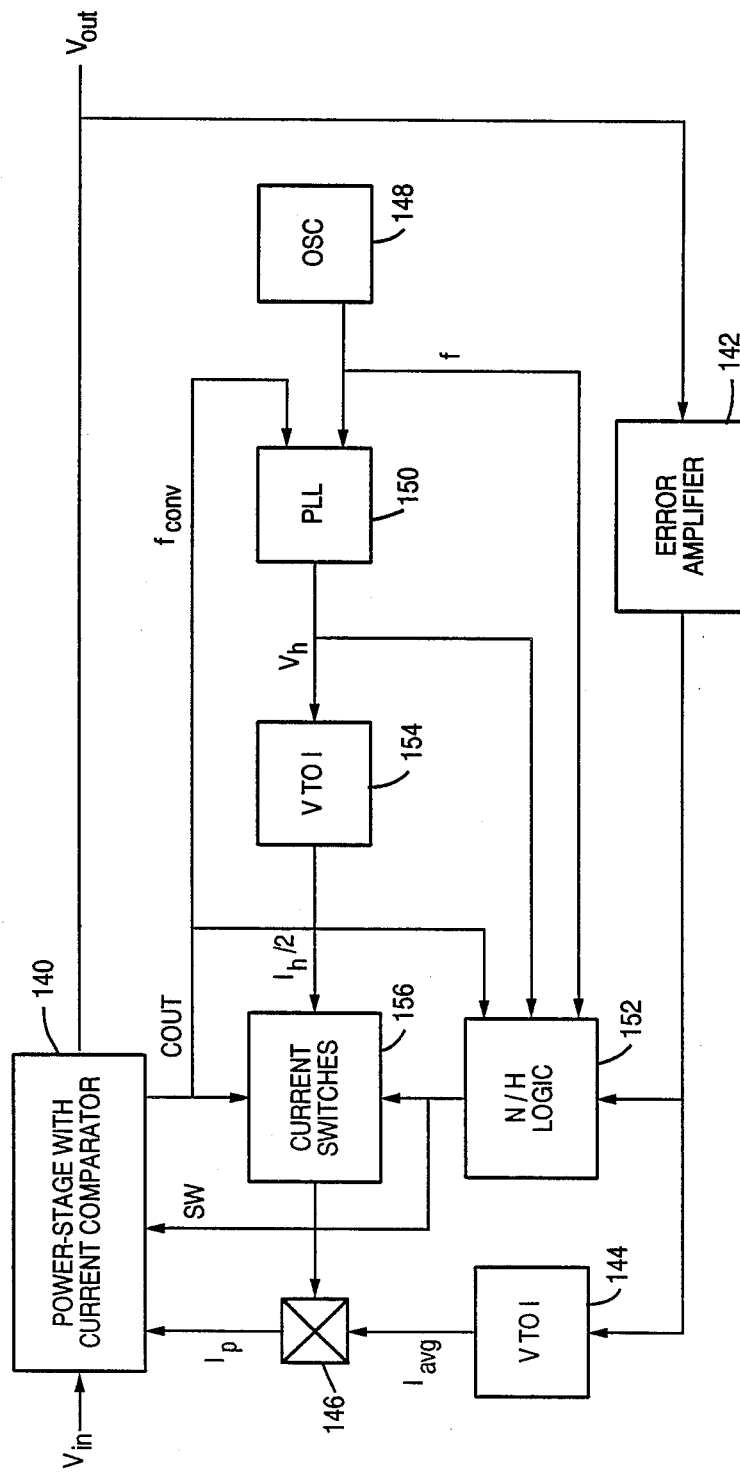
FIG. 11 shows a block diagram for a phase-locked-loop current-mode controlled DC to DC converter having a heavy/light mode boundary sense circuit and a means for switching between heavy and light mode operation.

The circuit of FIG. 11 shows a block diagram for a complete phase-locked-loop current-mode DC to DC converter which operates with hysteretic control in heavy and peak control in light mode. An input voltage $V_{in}$ is coupled to a power stage with comparator 140. The power stage develops an output voltage $V_{out}$. The output voltage $V_{out}$ is also coupled into a voltage divider and an error amp circuit 142. The output of the error amp 142 is coupled to a V to I converter 144 to form an average current $I_{avg}$. The average current is summed in a summing node 146 with other current described below to form a programming current $I_p$ to control the power stage 140.

An oscillator 148 develops a frequency f. A phase-locked-loop (PLL) circuit 150 is coupled to receive the frequency f and the converter frequency $f_{conv}$ of the power stage comparator output $C_{out}$. The PLL 150 develops an hysteretic voltage $V_h$ which is coupled into an N/H logic block 152 to determine whether the converter is operating in heavy mode or light mode. The N/H logic block is coupled to receive the frequency f and $C_{out}$. The N/H logic block is also coupled to control the power stage 140. The voltage $V_h$ is also coupled to a V to I converter 154 to form the control current $I_h$. The control current $I_h$ and the N/H logic block 152 are coupled to current switches 156. The current switches 156 are coupled to receive control from the comparator of the power stage 140. The output from current switches 156 are coupled into the summing node 146 to be summed with the average current $I_{avg}$.

The circuits presented in this patent are representative only and may be modified and changed according to any standard design practices available and still implement the present invention. An hysteretic current-mode controlled DC to DC converter is disclosed which operates with a stable frequency.

What is claimed is:

1. An hysteretic current-mode controlled stable frequency DC to DC buck power stage converter having an input voltage and an output voltage comprising:
   a. a power stage circuit having:
      (1) an inductor having an inductor current for forming the output voltage;
      (2) a capacitor coupled to said inductor;
      (3) a first control switch coupled to said inductor having an open position and a closed position;
      (4) means for oscillating said switch between said open position and said closed position thereby establishing a first duty cycle, said switch in said closed position coupling said input voltage to said power stage and said switch in said open position uncoupling said input voltage from said power stage; and
      (5) feedback means for controlling a peak value of the inductor current wherein the feedback means controls an average inductor current with a control signal whereby the non-feedback means establishes the turn-on and said turn-off limits symmetrically around the control signal; and
   b. non-feedback hysteretic control circuit for controlling said inductor current having a turn-on limit for closing said switch and a turn-off limit for opening the switch, said turn-on and turn-off limits being adjustable by said non-feedback control circuit to approximately maintain a constant frequency of oscillation wherein said control circuit is a nonlinear circuit comprising:
      (1) a first node;
      (2) a first voltage coupled to said node;
      (3) a first voltage controlled current source having a first terminal and a second terminal, said first terminal coupled to said first node;
      (4) a first NPN transistor having a first emitter, a first base and a first collector, said first collector and said first base coupled to said second terminal;
      (5) a first PNP transistor having a second emitter, a second base and a second collector, said second emitter coupled to said first emitter;
      (6) a second node;
      (7) ground coupled to said second node;
      (8) said second base and said second collector coupled to said second node;
      (9) a second PNP transistor having a third emitter, a third base and a third collector, said third emitter coupled to said first node;
      (10) a second NPN transistor having a fourth emitter, a fourth base and a fourth collector, said fourth collector coupled to said third collector and to said third base;
      (11) a third PNP transistor having a fifth emitter, a fifth base and a fifth collector, said fifth emitter coupled to said fourth emitter, said fifth base coupled to said second terminal and said fifth collector coupled to said second node;
      (12) a fourth PNP transistor having a sixth emitter, a sixth base and a sixth collector, said sixth emitter coupled to said first node and said sixth base coupled to said third base;
      (13) a third node coupled to said sixth collector;
      (14) a second voltage controlled current source having a third terminal and a fourth terminal, said third terminal coupled to said first node and said fourth terminal coupled to said fourth base;
      (15) a third NPN transistor having a seventh emitter, a seventh base and a seventh collector, said seventh collector and said seventh base coupled to said fourth terminal;
      (16) a fourth NPN transistor having an eighth emitter, an eighth base and an eighth collector, said eighth collector and said eighth base coupled to said seventh emitter;
      (17) a fifth PNP transistor having a ninth emitter, a ninth base and a ninth collector, said ninth emitter coupled to said eighth emitter;
      (18) a sixth PNP transistor having a tenth emitter, a tenth base and a tenth collector, said tenth emitter coupled to said ninth base and said ninth collector and said tenth collector and said tenth base coupled to said second node; and
      (19) a third voltage controlled current source having a fifth terminal and a sixth terminal, said fifth terminal coupled to said third node and said sixth terminal coupled to said second node, whereby said control current is generated in said third node to implement a hysteretic current control equation $$I_H = \frac{1}{fL} V_{out}\left(1 - \frac{V_{out}}{V_{in}}\right).$$

2. An hysteretic current-mode controlled stable frequency DC to DC buck power stage converter having an input voltage and an output voltage comprising:
   a. a power stage circuit having:
      (1) an inductor having an inductor current for forming the output voltage;
      (2) a capacitor coupled to said inductor;
      (3) a first control switch coupled to said inductor having an open position and a closed position;
      (4) means for oscillating said switch between said open position and said closed position thereby establishing a first duty cycle, said switch in said closed position coupling said input voltage to said power stage and said switch in said open position uncoupling said input voltage from said power stage; and
      (5) feedback means for controlling a peak value of the inductor current wherein the feedback means controls an average inductor current with a control signal whereby the non-feedback means establishes the turn-on and said turn-off limits symmetrically around the control signal; and
   b. non-feedback hysteretic control circuit for controlling said inductor current having a turn-on limit for closing said switch and a turn-off limit for opening the switch, said turn-on and turn-off limits being adjustable by said non-feedback control circuit to approximately maintain a constant frequency of oscillation wherein said control circuit establishes a duty cycle proportional control having;
      (1) a controlled switch having a first pole and a second pole, said controlled switch being controlled by a switching signal for switching said controlled switch between said first pole and said second pole, said first pole being coupled to a first voltage and said second pole coupled to a second voltage;

(2) a voltage filter and storage means coupled to a wiper of said controlled switch; and (3) a driver means coupled to said filter and storage means for forming said control current.

3. An hysteretic current-mode controlled stable frequency DC to DC boost power stage converter having an input voltage and an output voltage comprising:

a. a power stage circuit having:
(1) an inductor having an inductor current for forming the output voltage;
(2) a capacitor coupled to said inductor;
(3) a first control switch coupled to said inductor having an open position and a closed position;
(4) means for oscillating said switch between said open position and said closed position thereby establishing a first duty cycle, said switch in said closed position coupling said input voltage to said power stage and said switch in said open position uncoupling said input voltage from said power stage; and
(5) feedback means for controlling a peak value of the inductor current wherein the feedback means controls an average inductor current with a control signal whereby the non-feedback means establishes the turn-on and said turn-off limits symmetrically around the control signal; and b. non-feedback hysteretic control circuit for controlling said inductor current having a turn-on limit for closing said switch and a turn-off limit for opening the switch, said turn-on and turn-off limits being adjustable by said non-feedback control circuit to approximately maintain a constant frequency of oscillation wherein said control circuit establishes a duty cycle proportional control having;
(1) a controlled switch having a first pole and a second pole, said controlled switch being controlled by a switching signal for switching said controlled switch between said first pole and said second pole, said first pole being coupled to a first voltage and said second pole coupled to a second voltage;
(2) a voltage filter and storage means coupled to a wiper of said controlled switch; and
(3) a driver means coupled to said filter and storage means for forming said control current.

4. An hysteretic current-mode controlled stable frequency DC to DC buck-boost power stage converter having an input voltage and an output voltage comprising:

a. a power stage circuit having:
(1) an inductor having an inductor current for forming the output voltage;
(2) a capacitor coupled to said inductor;
(3) a first control switch coupled to said inductor having an open position and a closed position;
(4) means for oscillating said switch between said open position and said closed position thereby establishing a first duty cycle, said switch in said closed position coupling said input voltage to said power stage and said switch in said open position uncoupling said input voltage from said power stage; and
(5) feedback means for controlling a peak value of the inductor current wherein the feedback means controls an average inductor current with a control signal whereby the non-feedback means establishes the turn-on and said turn-off limits symmetrically around the control signal; and b. non-feedback hysteretic control circuit for controlling said inductor current having a turn-on limit for closing said switch and a turn-off limit for opening the switch, said turn-on and turn-off limits being adjustable by said non-feedback control circuit to approximately maintain a constant frequency of oscillation wherein said control circuit establishes a duty cycle proportional control having;
(1) a controlled switch having a first pole and a second pole, said controlled switch being controlled by a switching signal for switching said controlled switch between said first pole and said second pole, said first pole being coupled to a first voltage and said second pole coupled to a second voltage;
(2) a voltage filter and storage means coupled to a wiper of said controlled switch; and
(3) a driver means coupled to said filter and storage means for forming said control current.

* * * * *

UNITED STATES PATENT AND TRADEMARK OFFICE
CERTIFICATE OF CORRECTION

PATENT NO. : 4,929,882
DATED : May 29, 1990
INVENTOR(S) : Tamas S. Szepesi

It is certified that error appears in the above-identified patent and that said Letters Patent is hereby corrected as shown below: ON TITLE PAGE:

In the Abstract:

In Line 3, please replace "coupled" with --couples--.

In Line 5, please replace "conparater" with --comparator--.

In the Title:

Before "Apparatus" please insert --An--.

Please delete the "space" between the words "Feed" and "Back".

In Column 6, Line 6, please replace "conductor" with --comparator--.

In Column 6, Line 7, please replace "C out" with --$C_{out}$--.

In Column 10, Line 14, delete "in" and replace with --is--.

UNITED STATES PATENT AND TRADEMARK OFFICE
CERTIFICATE OF CORRECTION

PATENT NO. : 4,929,882

DATED : May 29, 1990

INVENTOR(S) : Tamas S. Szepesi

Page 2 of 2

It is certified that error appears in the above-identified patent and that said Letters Patent is hereby corrected as shown below:

In Column 11, Line 20, delete "H" and replace with --h--.

In Column 11, Lines 44 and 45, please replace " $1 \over R_i$ " with -- $1 \over R_i$ --.

In Column 11, Line 48, "$s^2\tau^{2i}$" should be replaced with --$s^2 \tau_i^2$--.

Signed and Sealed this

Fourteenth Day of January, 1992

*Attest:*

*Attesting Officer*

HARRY F. MANBECK, JR.

*Commissioner of Patents and Trademarks*